United States Patent [19]
Dumoulin et al.

[11] Patent Number: 6,122,172
[45] Date of Patent: Sep. 19, 2000

[54] POLYMER STUD GRID ARRAY

[75] Inventors: Ann Dumoulin, Zedelgem; Marcel Heerman, Merelbeke; Jean Roggen, Lummen; Eric Beyne, Leuven; Rita van Hoof, Boortmeerbeek, all of Belgium

[73] Assignees: Siemens NV, Brussels; Interuniversitair Micro-Electronica-Centrum VZW, Leuven, both of Belgium

[21] Appl. No.: 09/051,778
[22] PCT Filed: Oct. 10, 1996
[86] PCT No.: PCT/EP96/04407
§ 371 Date: Apr. 16, 1998
§ 102(e) Date: Apr. 16, 1998
[87] PCT Pub. No.: WO97/15078
PCT Pub. Date: Apr. 24, 1997

[30] Foreign Application Priority Data

Oct. 16, 1995 [DE] Germany .......................... 195 38 464

[51] Int. Cl.[7] ....................................................... H05K 7/20
[52] U.S. Cl. ......................... 361/719; 174/52.2; 361/704
[58] Field of Search ..................................... 361/704, 705, 361/707, 709–712, 717–719; 257/705, 713; 165/80.3, 185; 174/16.3, 252, 52.2

[56] References Cited

U.S. PATENT DOCUMENTS

| | | |
|---|---|---|
| 3,271,507 | 9/1966 | Elliott . |
| 4,868,349 | 9/1989 | Chia . |
| 5,012,386 | 4/1991 | McShane . |
| 5,081,520 | 1/1992 | Yoshii et al. . |
| 5,130,498 | 7/1992 | Yoshida . |
| 5,596,224 | 1/1997 | Murphy . |
| 5,609,889 | 3/1997 | Weber . |
| 5,929,516 | 7/1999 | Dumoulin et al. . |

FOREIGN PATENT DOCUMENTS

| | | |
|---|---|---|
| 0 645 811 A2 | 9/1994 | European Pat. Off. . |
| 0 645 953 A1 | 9/1994 | European Pat. Off. . |
| 37 32 249 A1 | 9/1987 | Germany . |
| 42 13 251 A1 | 4/1992 | Germany . |
| WO 89/00346 | 6/1988 | WIPO . |
| WO 89/10005 | 3/1989 | WIPO . |
| WO 92/02040 | 7/1991 | WIPO . |
| WO 92/02953 | 8/1991 | WIPO . |

OTHER PUBLICATIONS

Article entitled: "BGA—die Alternative", *Productronic Baugruppenfertigung*, (1994), pp. 45–55.

*Primary Examiner*—Gerald Tolin
*Attorney, Agent, or Firm*—Hill & Simpson

[57] ABSTRACT

In order to achieve better dissipation of the heat losses, a polymer stud grid array in proposed having
- an injection-molded, three-dimensional substrate (S) composed of an electrically insulating polymer,
- polymer studs (PS) which are arranged over the area on the underneath of the substrate (S) and are integrally formed during injection molding,
- external connections which are formed on the polymer studs (PS) by an end surface which can be soldered,
- conductor runs which are formed at least on the underneath of the substrate (S) and connect the external connections to internal connections,
- at least one heat sink (WL) which is partially coated during the injection molding of the substrate (S), and having
- at least one chip or wiring element (VE) which is arranged on the heat sink (WL) and whose connections are electrically conductively connected to the internal connections.

The new configuration is suitable in particular for power components or power modules in a polymer stud grid array package.

18 Claims, 1 Drawing Sheet

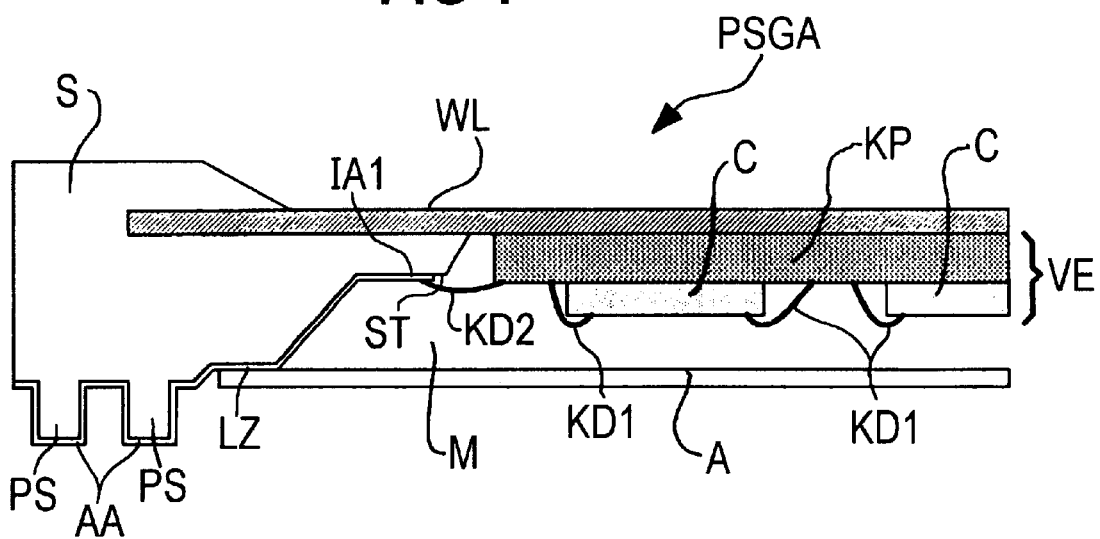

ved. The present invention is based on the knowledge that

POLYMER STUD GRID ARRAY

BACKGROUND OF THE INVENTION

The present invention relates generally to polymer stud grid arrays and, more specifically, to injection-molded substrates that carry electrical connections and that are equipped with heat sinks.

The number of connections on integrated circuits is becoming ever greater, while they are at the same time being miniaturized to an ever greater extent. The difficulties expected in the course of this increase in miniaturization in the application of solder paste and component fitment are intended to be overcome by new housing forms, single-chip, few-chip or multi-chip modules in a ball grid array package being preferred, in particular, for this purpose (DE-Z productronic 5, 1994, pages 54, 55). These modules are based on a plated-through substrate, on which the chips are made contact with, for example, via contact-making wires or by means of flip-chip mounting. The ball grid array (BGA) is located on the underside of the substrate, and is often also referred to as a solder grid array, land grid array or solder bump array. The ball grid array comprises solder studs arranged over the area on the underneath of the substrate, which allow surface mounting on printed circuit boards or assemblies. The arrangement of the solder studs over an area allows large numbers of connections to be provided, using a large grid size of, for example, 1.27 mm.

In the case of so-called MID technology (MID=Molded Interconnection Devices), injection-molded parts with integrated conductor runs are used instead of conventional printed circuits. High-quality thermoplastics, which are suitable for the injection molding of three-dimensional substrates, form the basis of this technology. Such thermoplastics are distinguished over conventional substrate materials for printed circuits by better mechanical, thermal, chemical, electrical and environmental characteristics. In the case of one specific direction of MID technology, the so-called technology of injection-molded parts with integrated conductor runs, the structuring of a metal layer applied to the injection-molded parts in carried out without using the otherwise normal mask technique, by means of a special laser structuring method.

In this case, a plurality of mechanical and electrical functions can be integrated in three-dimensional injection-molded parts with structured metallization. The housing support function at the same time provides guides and snap-action connections, while the metallization layer is used for electromagnetic shielding, and ensures good heat dissipation, as well as carrying out the wiring and connection function. Further details relating to the production of three-dimensional injection-molded parts with integrated conductor runs can be found, for example, in DE-A-37 32 249 or EP-A-0 361 192.

U.S. Pat. No. 5,081,520 discloses a method for mounting IC chips on substrates, in the case of which method the substrates are produced as injection-molded parts with integrated studs for attaching the IC chips. Once the studs have been metallized, a connecting layer is applied so that the IC chips can be mounted on the substrates, the chip connecting surfaces being electrically conductively connected to the associated metallizations on the studs.

International Application No. PCT/EP95/03763 has proposed a so-called polymer stud grid array (PSGA), which combines the advantages of a ball grid array (BGA) with the advantages of MID technology. The new version was called a polymer stud grid array (PSGA) on the basis of the ball grid array (BGA), the term "polymer stud" being intended to refer to the polymer studs which are integrally formed during the injection molding of the substrate. The new version is suitable for single-chip, few-chip or multi-chip modules and comprises an injection-molded, three-dimensional substrate composed of an electrically insulating polymer, polymer studs which are arranged over the area on the underneath of the substrate and are integrally formed during injection molding, external connections which are formed on the polymer studs by an end surface which can be soldered, conductor runs which are formed at least on the underneath of the substrate and connect the external connections to internal connections, at least one chip which is arranged on the substrate and whose connections are electrically conductively connected to the internal connections.

In addition to the simple and cost-effective production of the polymer studs during the injection molding of the substrate, the production of the external connections on the polymer studs can also be carried out with minimal effort together with the production of the conductor runs, which is normal for MID technology and the technique of injection-molded parts with integrated conductor runs. The fine laser structuring which is preferred for the technique of injection-molded parts with integrated conductor runs allows the external connections to be produced on the polymer studs with a large number of connections and with a very fine grid. It should furthermore be stressed that the thermal expansion of the polymer studs corresponds to the thermal expansion of the substrate and to that of the printed circuit board accommodating the module. Should any mechanical stresses occur, then the elastic characteristics of the polymer studs allow the stresses to be at least partially compensated for. The dimensional stability of the external connections formed on the polymer studs also allows the reliability for repair and replacement to be considerably improved over ball grid arrays, whose external connections are formed by solder studs.

SUMMARY OF THE INVENTION

The present invention is based on the problem of providing a polymer stud grid array in which improved dissipation of heat losses is achieved.

The present invention is based on the knowledge that, during the production of the substrates of polymer stud grid arrays by injection molding, a heat sink can be partially embedded in the substrate material, with little additional cost. Only one injection mold is required for this purpose, in which the heat sink can be positioned at a predetermined point before the injection-molding process. After the production of the polymer stud grid array, this then ensures very good dissipation of heat losses from a chip arranged on the heat sink or from a wiring element arranged on the heat sink.

The present invention allows recessed mounting of chips or wiring elements in troughs in the injection-molded substrates, the base of which troughs in formed by the heat sink. This makes it possible for the resulting single-chip, few-chip or multi-chip modules to be extremely thin. In addition, the recessed mounting allows optimum protection of the chips or wiring elements.

The present invention, makes it possible to introduce the heat sinks into the substrate material particularly easily during injection molding. In addition, the disk shape of the heat sink assists the fitting of a chip or of a wiring element.

The present invention allows an assembly to be formed from the substrate and heat sink, with low stresses even at different temperatures.

In an embodiment, it is particularly advantageous for the heat sink to be composed of metal, or alloys including chromium, nickel or a mixture thereof which allow good thermal conductivity with low thermal expansion at the same time.

In an embodiment, a heat sink composed of ceramic can also successfully be used, in this case, in an embodiment, the heat sink preferably being composed, in particular, of aluminum oxide. Such ceramic materials also ensure good thermal conductivity with low thermal expansion at the same time.

In an embodiment allows the chips or wiring elements to be mounted on the heat sink particularly easily, the adhesive also ensuring good heat transfer to the heat sink.

In an embodiment allows simple means to be used for reliable protection of the chips or wiring elements arranged in troughs in the substrates.

In an embodiment, the present invention provides a polymer stud grid array which comprises an injection-molded substrate fabricated from an electrically insulating polymer. The substrate comprises an underside having at least one integrally formed stud extending downward therefrom. The stud is connected to an external connection which is attached to the stud and the substrate by way of its end surface which can be soldered. The external connection is connected to an internal connection by a conductor. The substrate is connected to at least one heat sink which, in the preferred embodiment, is formed during the injection-molding of the substrate and, consequently, the heat sink is at least partially coated with the electrically insulating polymer. The heat sink engages at least one element that is connected to the at least one internal connection.

Other objects and advantages of the present invention will become apparent from reading the following detailed description and appended claims, and upon reference to the accompanying drawings.

BRIEF DESCRIPTION OF THE DRAWING

An exemplary embodiment of the invention is illustrated in the drawing, wherein:

FIG. 1 is a schematic sectional view of a polymer stud grid array made in accordance with the present invention.

It should be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

DETAILED DESCRIPTION OF THE PRESENTLY PREFERRED EMBODIMENTS

The drawing shows a highly simplified schematic illustration of a section through a part of a polymer stud grid array PSGA with a wiring element VE with which contact is made using a wire bonding technique.

The basis of the illustrated array is a substrate S which is provided with polymer studs PS and a trough M, the trough having a step, which is designated ST. The base of the trough M is formed by a heat sink WL. As can be seen, this heat sink WL is formed by a disk, whose edge region is embedded in the substrate material. The heat sink WL in the form of a disk could, if required, also be provided with additional cooling ribs on the outside. The production of the substrate S, including the polymer studs PS, the trough M and the step ST, is carried out by injection molding, thermoplastics such as polyetherimide which are resistant to high temperatures being suitable as substrate materials. At the same time, the heat sink WL, which is composed of metal or ceramic for example, is also anchored at the edge in the substrate material during injection molding.

In the illustrated exemplary embodiment, the wiring element VE is composed of a ceramic plate KP whose rear side is bonded to the heat sink WL, and on whose front a plurality of chips C are fitted. The connections of the chips C are connected via contact-making wires KD1 to associated connections of a wiring layer which is formed on the front of the ceramic plate KP but cannot be seen in the drawing. The connections of the wiring element VE are connected via contact-making wires KD2 to the internal connections of the array, which are arranged on the step ST of the trough M, but cannot be seen in more detail in the drawing. The external connections formed on the polymer studs PS and the conductor runs which connect these external connections to the internal connections on the step ST cannot be seen in the drawing either. Details relating to the production and configuration of the external connections, the internal connections and the conductor runs can be found in International Application No. PCT/EP95/03763, whose disclosures are part of the present application.

The drawing, as set forth more fully in International Application No. PCT/EP95/03763, illustrates the placement of the outside terminals AA on the studs PS and the connection of the outside terminals AA to the inside terminals, one of which is shown at IA1, by the interconnection LZ.

The drawing also shows that the trough M is closed by a cover A. This cover A is composed of plastic or metal and ensures reliable protection of the wiring element VE arranged in the trough M. However, instead of the cover A, the trough M could also be filled with a plastic, for example with epoxy resin, in order to form and encapsulation.

From the above description, it is apparent that the objects of the present invention have been achieved. While only certain embodiments have been set forth, alternative embodiments and various modifications will be apparent from the above description to those skilled in the art. These and other alternatives are considered equivalents and within the spirit and scope of the present invention.

We claim:

1. A polymer stud grid array comprising:
   an injection-molded substrate fabricated from an electrically insulating polymer, the substrate comprising an underside having at least one integral stud extending downward therefrom,
   the stud having an outside terminal thereon, the outside terminal comprising an end surface which can be soldered, the outside terminal being connected to an an inside terminal by an interconnection, said inside terminal being located on said substrate,
   the substrate being connected to at least one heat sink which is partially coated with the electrically insulating polymer, the heat sink comprising a disk that is partially embedded in the substrate, the heat sink also being connected to at least one wiring element that is connected to the inside terminal.

2. The polymer stud grid array of claim 1 wherein the wiring element further comprises at least one chip.

3. The polymer stud grid array of claim 1 wherein the substrate comprises a trough, the wiring element being disposed in the trough and mounted to the heat sink, the trough being partially bound by the heat sink.

4. The polymer stud grid array of claim 1 wherein the heat sink comprises a heat conductive material with a low coefficient of thermal expansion.

5. The polymer stud grid array of claim 1 wherein the heat sink comprises metal.

6. The polymer stud grid array of claim 1 wherein the heat sink comprises a material selected from the group consisting of a chromium alloy, a nickel alloy or a chromium-nickel alloy.

7. The polymer stud grid array of claim 1 wherein the heat sink comprises a ceramic material.

8. The polymer stud grid array of claim 1 wherein the heat sink comprises aluminum oxide.

9. The polymer stud grid array of claim 1 wherein the wiring element is attached to the heat sink.

10. The polymer stud grid array of claim 1 wherein the trough is enclosed by a cover.

11. A polymer stud grid array comprising:
a three-dimensional, injection-molded substrate fabricated from an electrically insulating polymer, the substrate comprising an underside with a plurality of integrally formed studs extending downward therefrom,
each stud having at least an outside terminal thereon, each outside terminal comprising an end surface which can be soldered to secure said outside terminal to the stud and the substrate, each outside terminal being connected to at least inside terminal by an interconnection, said inside terminal being located on said substrate,
the substrate being connected to at least one heat sink which is partially coated with the electrically insulating polymer, the heat sink further comprising a disk having an edge that is embedded in the substrate, the heat sink being attached to the substrate during the injection molding thereof, the heat sink also being connected to at least one wiring element that is connected to the inside terminals.

12. The polymer stud grid array of claim 11 wherein the wiring element further comprises at least one chip.

13. The polymer stud grid array of claim 11 wherein the substrate comprises a trough, the wiring element being disposed in the trough and connected to the heat sink, the trough being partially bound by the heat sink.

14. The polymer stud grid array of claim 11 wherein the heat sink comprises a material selected from the group consisting of a chromium alloy, a nickel alloy or a chromium-nickel alloy.

15. The polymer stud grid array of claim 11 wherein the heat sink comprises a ceramic material.

16. The polymer stud grid array of claim 11 wherein the heat sink comprises aluminum oxide.

17. The polymer stud grid array of claim 11 wherein the wiring element is attached to the heat sink.

18. The polymer stud grid array of claim 11 wherein the trough is enclosed by a cover.

* * * * *